United States Patent
Kim et al.

(10) Patent No.: US 9,529,714 B2
(45) Date of Patent: Dec. 27, 2016

(54) ELECTRONIC DEVICE

(71) Applicants: Yang-Kon Kim, Gyeonggi-do (KR); Bo-Mi Lee, Gyeonggi-do (KR); Won-Joon Choi, Gyeonggi-do (KR); Guk-Cheon Kim, Gyeonggi-do (KR); Daisuke Watanabe, Tokyo (JP); Makoto Nagamine, Tokyo (JP); Young-Min Eeh, Tokyo (JP); Koji Ueda, Tokyo (JP); Toshihiko Nagase, Tokyo (JP); Kazuya Sawada, Tokyo (JP)

(72) Inventors: Yang-Kon Kim, Gyeonggi-do (KR); Bo-Mi Lee, Gyeonggi-do (KR); Won-Joon Choi, Gyeonggi-do (KR); Guk-Cheon Kim, Gyeonggi-do (KR); Daisuke Watanabe, Tokyo (JP); Makoto Nagamine, Tokyo (JP); Young-Min Eeh, Tokyo (JP); Koji Ueda, Tokyo (JP); Toshihiko Nagase, Tokyo (JP); Kazuya Sawada, Tokyo (JP)

(73) Assignees: SK Hynix Inc., Gyeonggi-do (KR); Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 14/559,509

(22) Filed: Dec. 3, 2014

(65) Prior Publication Data
US 2015/0357557 A1     Dec. 10, 2015

(30) Foreign Application Priority Data
Jun. 9, 2014 (KR) .................. 10-2014-0069524

(51) Int. Cl.
*H01L 43/08* (2006.01)
*G06F 12/08* (2016.01)
*G11C 11/16* (2006.01)

(52) U.S. Cl.
CPC ......... *G06F 12/0802* (2013.01); *G11C 11/161* (2013.01); *H01L 43/08* (2013.01)

(58) Field of Classification Search
CPC .......... H01L 43/02; H01L 43/08; H01L 43/10; G11C 11/14–11/16; G11C 11/161
See application file for complete search history.

(56) References Cited

U.S. PATENT DOCUMENTS

| 7,848,059 B2* | 12/2010 | Yoshikawa | B82Y 25/00 360/313 |
| 7,889,543 B2* | 2/2011 | Morise | G11C 11/16 365/158 |
| 8,063,459 B2* | 11/2011 | Ranjan | B82Y 25/00 257/421 |

(Continued)

FOREIGN PATENT DOCUMENTS

KR     1020060048867     5/2006

*Primary Examiner* — Allison P Bernstein
(74) *Attorney, Agent, or Firm* — I P & T Group LLP

(57) ABSTRACT

An electronic device includes a semiconductor memory, and the semiconductor memory includes a first magnetic layer having a variable magnetization direction; a second magnetic layer having a pinned magnetization direction; and a tunnel barrier layer interposed between the first magnetic layer and the second magnetic layer, wherein the second magnetic layer includes a ferromagnetic material with molybdenum (Mo) added thereto.

8 Claims, 7 Drawing Sheets

(56) References Cited

U.S. PATENT DOCUMENTS

| | | | |
|---|---|---|---|
| 8,084,835 B2 * | 12/2011 | Ranjan | B82Y 10/00 257/421 |
| 8,665,639 B2 * | 3/2014 | Nagase | B82Y 25/00 365/158 |
| 2012/0040089 A1 | 2/2012 | Lin | |

* cited by examiner

ELECTRONIC DEVICE

CROSS-REFERENCE TO RELATED APPLICATION

This patent document claims priority of Korean Patent Application No. 10-2014-0069524, entitled "ELECTRONIC DEVICE AND METHOD FOR FABRICATING THE SAME" and filed on Jun. 9, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device facilitates fabricating processes and can improve characteristics of a variable resistance element.

In one aspect, an electronic device includes a semiconductor memory, and the semiconductor memory includes a first magnetic layer having a variable magnetization direction; a second magnetic layer having a pinned magnetization direction; and a tunnel barrier layer interposed between the first magnetic layer and the second magnetic layer, wherein the second magnetic layer includes a ferromagnetic material with molybdenum (Mo) added thereto.

Implementations of the above electronic device may include one or more the following.

The ferromagnetic material is FeCoB. A concentration of the molybdenum of the second magnetic layer is less than 10%. The second magnetic layer has a thickness of 10 Å or more and 30 Å or less. The first magnetic layer includes a ferromagnetic material same as the ferromagnetic material except for the molybdenum.

In another aspect, an electronic device includes a semiconductor memory, and the semiconductor memory includes a first magnetic layer having a variable magnetization direction; a second magnetic layer having a pinned magnetization direction; and a tunnel barrier layer interposed between the first magnetic layer and the second magnetic layer, wherein the second magnetic layer includes a ferromagnetic material with a non-magnetic material added thereto, and a concentration of the non-magnetic material of the second magnetic layer is less than 10%.

Implementations of the above electronic device may include one or more the following.

The magnetization directions of the first and second magnetic layers are substantially perpendicular to a surface of a layer, and the second magnetic layer has a thickness of 10 Å or more and 30 Å or less. A standard electrode potential of the non-magnetic material is −0.2 or more. The non-magnetic material is a refractory metal. The non-magnetic material is molybdenum (Mo), niobium (Nb), tantalum (Ta) and/or tungsten (W). The first magnetic layer includes a ferromagnetic material same as the ferromagnetic material except for the non-magnetic material.

In another aspect, an electronic device includes a semiconductor memory, and the semiconductor memory includes a first magnetic layer having a variable magnetization direction; a second magnetic layer having a pinned magnetization direction; and a tunnel barrier layer interposed between the first magnetic layer and the second magnetic layer, wherein the second magnetic layer includes a ferromagnetic material with a refractory metal added thereto.

Implementations of the above electronic device may include one or more the following.

The refractory metal is molybdenum (Mo), niobium (Nb), tantalum (Ta) and/or tungsten (W). The first magnetic layer includes a ferromagnetic material same as the ferromagnetic material except for the refractory metal.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1A:
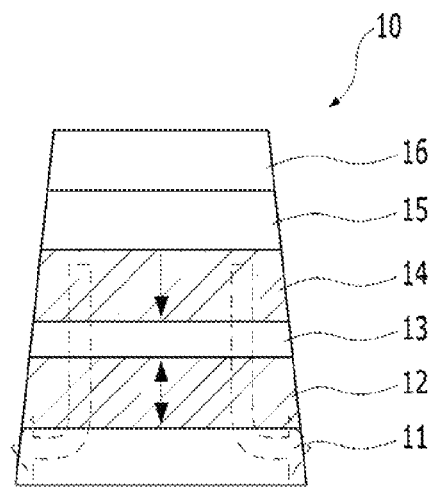
FIG. 1A is a cross-sectional view illustrating a variable resistance element in accordance with a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
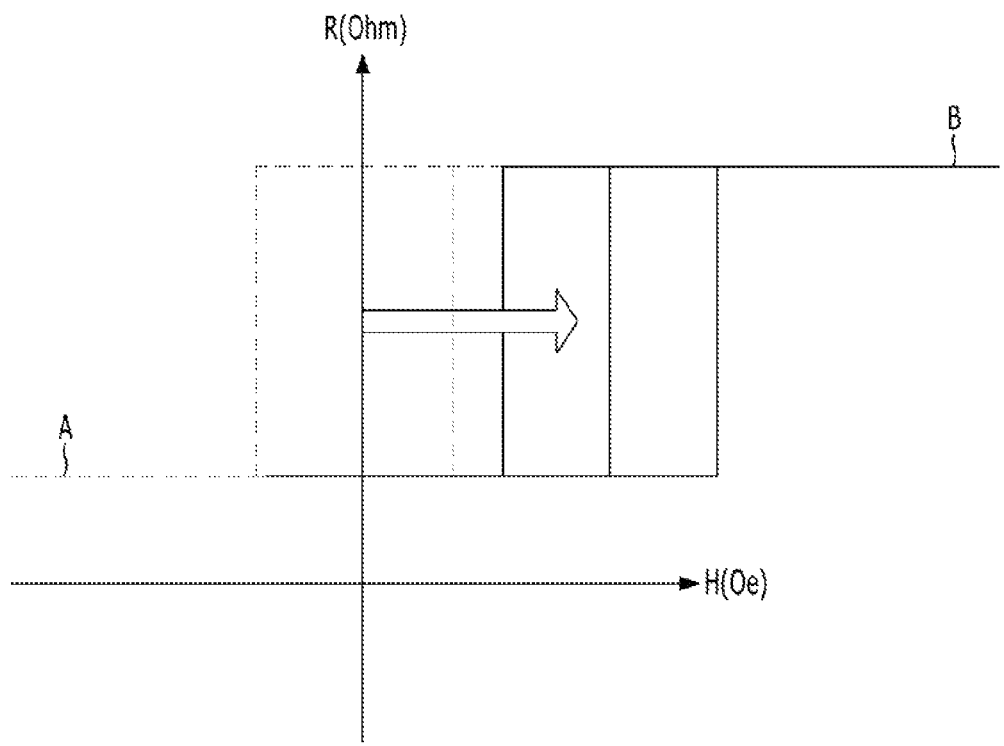
FIG. 1B is a view showing a magnetization curve of the first magnetic layer of FIG. 1A.

FIG. 1A is a cross-sectional view illustrating a variable resistance element in accordance with a comparative example, and FIG. 1B is a view showing a magnetization curve of a first magnetic layer of FIG. 1A.

First, referring to FIG. 1A, a variable resistance element 10 may include a MTJ (Magnetic Tunnel Junction) structure including a first magnetic layer 12 having a variable magnetization direction, a second magnetic layer 14 having a pinned magnetization direction, and a tunnel barrier layer 13 interposed between the first magnetic layer 12 and the second magnetic layer 14. In addition to the MTJ structure, the variable resistance element 10 may further include some layers performing various functions. Such layer may improve a characteristic of the MTJ structure or may facilitate fabricating processes.

The first magnetic layer 12 and the second magnetic layer 14 may include a ferromagnetic material. The ferromagnetic material may include a Fe alloy, a Co alloy, or a combination thereof. Particularly, in the comparative example, the first magnetic layer 12 and the second magnetic layer 14 may include FeCoB. A magnetization direction of the first magnetic layer 12 is changeable. Thus, the first magnetic layer 12 may store data depending on the magnetization direction thereof, and may be referred to as a free layer or a storage layer, etc. Also, since the magnetization direction of the second magnetic layer 14 is fixed, the second magnetic layer 14 may be referred to as a pinned layer or a reference layer, etc. As represented by solid arrows in FIG. 1A, the magnetization directions of the first and second magnetic layers 12 and 14 may be substantially perpendicular to surfaces of the layers 12, 14.

The tunnel barrier layer 13 may cause a change in the magnetization direction of the first magnetic layer 12 by tunneling of spin-polarized electrons, e.g., in form of a current flowing through the layers of the variable resistance element 10. The tunnel barrier layer 13 may include insulating oxide such as MgO, CaO, SrO, TiO, VO, or NbO, etc.

The variable resistance element 10 may be operated to store data as described below. When a current or voltage is supplied through a contact plug (not shown) coupled to a bottom end of the variable resistance element 10 and another contact plug (not shown) coupled to a top end of the variable resistance element 10, the magnetization direction of the first magnetic layer 12 may change so that the magnetization directions of the first magnetic layer 12 and the second magnetic layer 14 become parallel or non-parallel to each other. For example, when the magnetization directions are parallel to each other, the variable resistance element 10 may exhibit a low resistance state and store data "0" and, when the magnetization directions are non-parallel to each other, the variable resistance element 10 may exhibit a high resistance state and store data "1".

However, since the ferromagnetic material used as the second magnetic layer 14, for example, FeCoB has a large value of Ms (Magnetic Saturation), a very strong stray field may be generated by the second magnetic layer 14 (see dotted arrows). Under the influence of this stray field, a bias magnetic field in the first magnetic layer 12 may be generated. This is described in more detail with reference to FIG. 1B.

In FIG. 1B a dotted line A shows a case where a bias magnetic field does not exist in the first magnetic layer 12, and a solid line B shows a case where a bias magnetic field exists in the first magnetic layer 12.

Referring to FIG. 1B, when the bias magnetic field does not exist in the first magnetic layer 12, the magnetization curve is symmetric with respect to a magnetization axis. Therefore, a switching of a resistance state in the variable resistance element 10, e.g., from a low resistance state to a high resistance state or vice versa, may occur symmetrically.

On the other hand, when the magnetization curve shifts, for example, to a right side (see the arrow) by a bias magnetic field in the first magnetic layer 12, the magnetization curve is no longer symmetric with respect to the magnetization axis. Therefore, an unsymmetrical switching may occur, thereby deteriorating a switching characteristic of the variable resistance element 10.

To sum up, in the comparative example, the switching characteristic of the variable resistance element 10 may be deteriorated due to influence of the strong stray field generated by the second magnetic layer 14.

By an implementation which will be described below, the above issue may be addressed and furthermore, various characteristics required for a variable resistance element may be satisfied.

Figure 2:
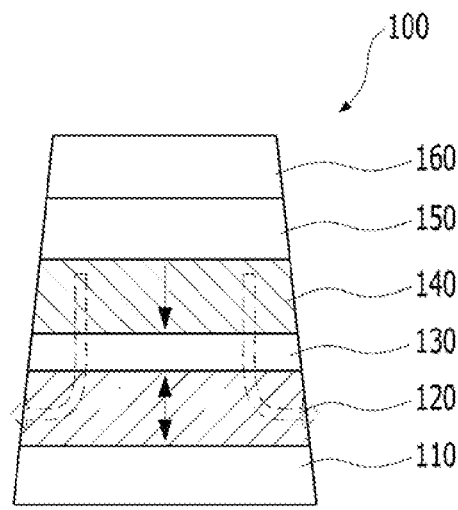
FIG. 2 is a cross-sectional view illustrating a variable resistance element in accordance with an implementation.

FIG. 2 is a cross-sectional view illustrating a variable resistance element in accordance with an implementation.

Referring to FIG. 2, a variable resistance element 100 may include a MTJ structure including a first magnetic layer 120 having a variable magnetization direction, a second magnetic layer 140 having a pinned magnetization direction, and a tunnel barrier layer 130 interposed between the first magnetic layer 120 and the second magnetic layer 140.

The first magnetic layer 120 may include ferromagnetic material. The ferromagnetic material may include an alloy in which the main component is Fe and/or Co. For example, the first magnetic layer 120 may include FeCoB. As represented by a solid arrow, the magnetization direction of the first magnetic layer 120 may be substantially perpendicular to a surface of the first magnetic layer 120. That is, the magnetization direction of the first magnetic layer 120 may be changed between a downward direction from top to bottom and an upward direction from bottom to top.

The second magnetic layer 140 may include ferromagnetic material with a non-magnetic material added thereto. The ferromagnetic material may include an alloy in which the main component is Fe and/or Co, for example, FeCoB. The non-magnetic material may include various transition metals such as Zr, Nb, Mo, Tc, Ru, Ta, W, etc. The ferromagnetic material with the non-magnetic material added thereto indicates the ferromagnetic material is the main component and the non-magnetic material is a relatively minor component. As represented by a solid arrow, the magnetization direction of the second magnetic layer 140 may be substantially perpendicular to the surface of the second magnetic layer 140. That is, the magnetization direction of the second magnetic layer 140 may be in a downward direction. When the second magnetic layer 140 includes a non-magnetic material, the value of Ms of the second magnetic layer 140 may be reduced. Experimental results comparing Ms*t versus thickness is shown in FIG. 3.

Figure 3:
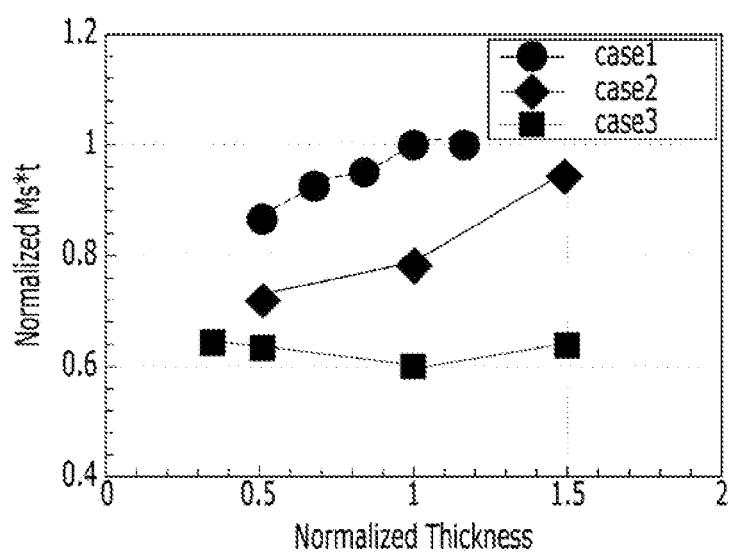
FIG. 3 is a graph illustrating a value of Ms*t depending on a thickness of a second magnetic layer.

FIG. 3 is a graph illustrating Ms*t values versus thickness of the second magnetic layer 140. Specifically, the horizontal axis of FIG. 3 represents the thickness and the vertical axis of FIG. 3 represents normalized Ms*t (Magnetic Saturation*thickness). Case1 of FIG. 3 reports values in which the second magnetic layer is FeCoB without the addition of a non-magnetic material, similar to the MTJ structure of the comparative example. Case2 of FIG. 3 represents a second magnet layer comprised of FeCoB with 5% molybdenum (Mo). Case3 of FIG. 3 represents a second magnetic layer comprised of FeCoB with 10% molybdenum (Mo).

Referring to FIG. 3, the value of Ms*t of Case2 or Case3 is reduced compared to Case1.

Therefore, in comparison with the comparative example, the stray field generated by the second magnetic layer 140 may be reduced, and the bias magnetic field in the first magnetic layer 120 may be reduced in this implementation. As a result, switching characteristics of the variable resistance element 100 may be improved compared to the comparative example.

However, although the second magnetic layer 140 includes non-magnetic material to reduce the stray field from the second magnetic layer 140 other characteristics required for the variable resistance element 100 should not deteriorate. That is, in order to satisfy various characteristics required for the variable resistance elements 100, type and/or a content of the non-magnetic material, thickness of the second magnetic layer 140 and the like should be precisely controlled while the second magnetic layer 140 includes the non-magnetic material. Since it is not necessary to reduce a stray field from the first magnetic layer 120, the first magnetic layer 120 may not include the non-magnetic material to maintain its required characteristics.

The tunnel barrier layer 130 may change the magnetization direction of the first magnetic layer 120 by tunneling of spin-polarized electrons, e.g., in the form of current flowing through the layers of the variable resistance element 100. The tunnel barrier layer 130 may include insulating oxide such as MgO, CaO, SrO, TiO, VO, or NbO, etc.

In the above MTJ structure, positions of the first magnetic layer 120 and second magnetic layer 140 may be reversed. That is, it is possible that the second magnetic layer 140 serving as a pinned layer is located under the first magnetic layer 120 serving as a free layer.

Furthermore, in addition to the MTJ structure, the variable resistance element 100 may further include other layers performing various functions. For example, one or more layers may be included to improve characteristics of the MTJ structure or facilitate fabricating processes. In this implementation, the variable resistance element 100 may further include an under layer 110 which is disposed under the MTJ structure, a magnetic correction layer 150 which is disposed over the MTJ structure and/or a capping layer 160 which is provided at an uppermost part of the variable resistance element 100.

The under layer 110 may perform various functions as needed. For example, the under layer 110 may increase adhesion between a contact plug (not shown) disposed under the variable resistance element 100 and a layer disposed over the under layer 110, for example, the first magnetic layer 120. In addition, the under layer 110 may improve the quality of the layer disposed over the under layer 110 such as crystallinity, roughness, etc. However, other implementations are also possible for the under layer 110. The under layer 110 may be a single-layered structure or a multi-layered structure interposed between the MTJ structure and the contact plug (not shown).

The magnetic correction layer 150 may offset influence of the stray field generated by the second magnetic layer 140. The magnetic correction layer 150 may include anti-ferromagnetic material or ferromagnetic material which has a magnetization direction non-parallel to the magnetization direction of the second magnetic layer 140. In this case, as influence on the first magnetic layer 120 that is caused by the stray field of the second magnetic layer 140 is reduced, a bias magnetic field in the first magnetic layer 120 may be further reduced. Since the stray field of the second magnetic layer 140 is reduced due to the non-magnetic material included in the second magnetic layer 140, the thickness of the magnetic correction layer 150 may be reduced compared to when the second magnetic layer 140 does not include the non-magnetic material. Furthermore, the magnetic correction layer 150 may be omitted. Since the thickness to be etched is reduced in the patterning process for forming the variable resistance element 100, the patterning process may be facilitated.

The capping layer 160 may serve as a hard mask in the patterning process for forming the variable resistance element 100 and may include various conductive materials.

However, a layered-structure of the variable resistance element 100 is not limited to the layered-structure shown in FIG. 2. The variable resistance element 100 may have various layered-structures as long as the variable resistance element 100 includes the MTJ structure.

An example of a method for fabricating the variable resistance element 100 is described. First, the under layer 110, the first magnetic layer 120, the tunnel barrier layer 130 and the second magnetic layer 140, the magnetic correction layer 150 and the capping layer 160 may be sequentially formed over a substrate (not shown) in which certain lower structures are formed. The second magnetic layer 140 may be formed by depositing an alloy of ferromagnetic material and non-magnetic material over the tunnel barrier layer 130 or by performing co-sputtering of ferromagnetic material and non-magnetic material. Then, the under layer 110, the first magnetic layer 120, the tunnel barrier layer 130 and the second magnetic layer 140, the magnetic correction layer 150 and the capping layer 160 may be etched using a mask (now shown). As a result, the variable resistance element 100 which is patterned may be formed in a certain shape.

Meanwhile, as described above, the second magnetic layer 140 should be precisely controlled in order to prevent deterioration of characteristics of the variable resistance element 100. This is described below in more detail.

First, the non-magnetic material content of the second magnetic layer 140 may be less than 10%. That is, when the second magnetic layer 140 is FeCoBX (where, X is non-magnetic material), the mathematical formula of X/FeCoBX<0.1 may be satisfied. It is desirable to maintain the content of the non-magnetic material less than 10% because the value of TMR (Tunneling Magneto-Resistance) is greatly reduced when the content of the non-magnetic material is 10% or more. The value of TMR may be substantially proportional to the difference in resistance between the low resistance state and the high resistance state. Therefore, when the value of TMR is small the variable resistance element 100 cannot effectively serve as an actual variable resistance element which stores data using the difference in resistance between the low resistance state and the high resistance state. The results of an experiment related to are shown in FIG. 4.

Figure 4:
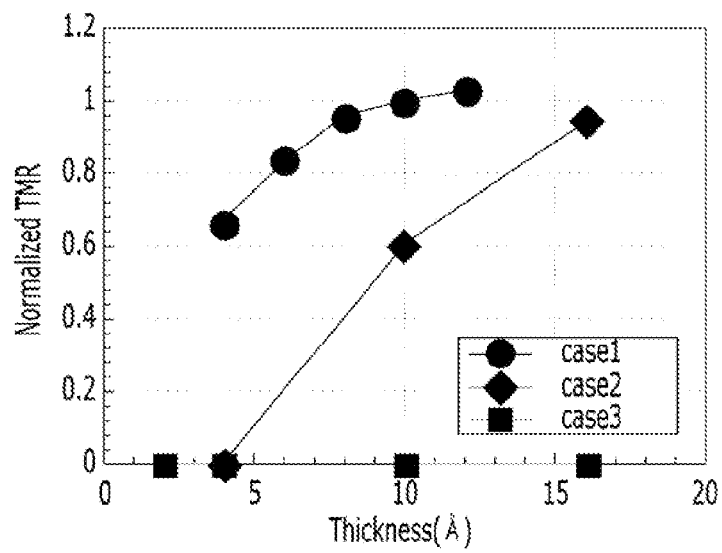
FIG. 4 is a graph illustrating a value of TMR depending on a content of a non-magnetic material and a thickness of a second magnetic layer.

FIG. 4 is a graph illustrating a value of TMR depending on the content of non-magnetic material and the thickness of the second magnetic layer. Specifically, the horizontal axis of FIG. 4 represents the thickness of the second magnetic layer and the vertical axis of FIG. 4 represents a normalized value of TMR. Case1 of FIG. 4 represents a second magnetic layer having FeCoB without adding a non-magnetic material, similar to the MTJ structure of the comparative example. Case2 of FIG. 4 represents a second magnetic layer having FeCoB with 5% of molybdenum (Mo). Case3 of FIG. 4 represents a second magnetic layer having FeCoB with 10% of molybdenum (Mo).

Referring to FIG. 4, Case3, it is shown that the value of TMR is substantially 0, regardless of the thickness of the second magnetic layer. That is, when the content of the added non-magnetic material is 10%, there is no difference in resistance between the low resistance state and the high resistance state, so the MTJ structure cannot have a variable resistance characteristic. On the other hand, in Case2, when the thickness of the second magnetic layer increases to a certain level, for example, 10 Å or more, the value of TMR becomes close to that of Case1.

As a result, when the content of the non-magnetic material that is added to the second magnetic layer is less than 10%, the stray field from the second magnetic layer may be reduced and the required value of TMR may be satisfied.

The second magnetic layer 140 with the non-magnetic material having an appropriate content may have a thickness between 10 Å and 30 Å. This is because the required TMR value may be satisfied when the thickness of the second magnetic layer 140 is 10 Å or more, as described above. Furthermore, as shown in the result of the experiment of FIG. 5, the magnetization direction of the second magnetic layer 140 may not be perpendicular to the surface of the second magnetic layer 140 when the thickness of the second magnetic layer 140 is larger than 30 Å.

Figure 5:
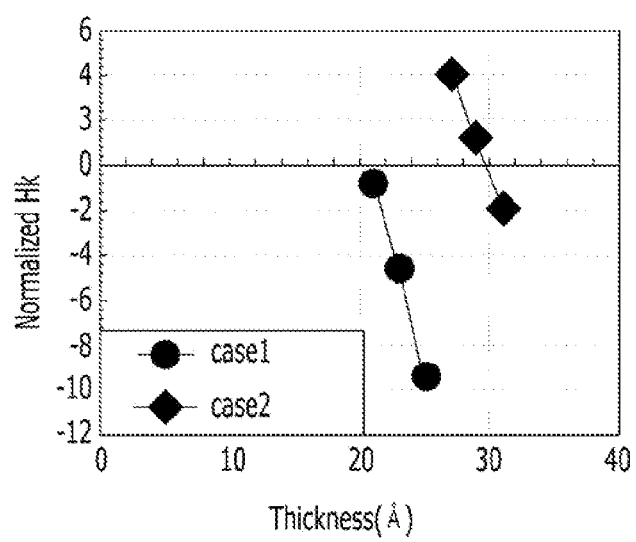
FIG. 5 is a graph illustrating a value of Hk depending on a content of a non-magnetic material and a thickness of a second magnetic layer.

FIG. 5 is a graph illustrating a value of Hk depending on non-magnetic material content and the thickness of a second magnetic layer. Specifically, the horizontal axis of FIG. 5 represents thickness of the second magnetic layer and the vertical axis of FIG. 5 represents a normalized value of Hk (perpendicular anisotropy field). Case1 of FIG. 5 represents a second magnetic layer having FeCoB without adding non-magnetic material, similar to the MTJ structure of the comparative example. Case2 of FIG. 5 represents a second magnetic layer having FeCoB with 5% of molybdenum (Mo).

Referring to FIG. 5, Case2, the magnetization direction of the second magnetic layer is not perpendicular when the thickness of the second magnetic layer is larger than 30 Å.

As a result, it is desirable that the second magnetic layer with the non-magnetic material has a thickness of 30 Å or less so that the stray field from the second magnetic layer may be reduced, and the required value of Hk may be satisfied. Furthermore, it is desirable that the second magnetic layer has a thickness of 10 Å or more so that the required value of TMR may also be satisfied.

Third, a metal with a standard electrode potential ($E°$ (V)) is higher than a certain threshold value, for example, −0.2 or more may be used as the non-magnetic material added to the second magnetic layer 140. For example, Mo, Nb, Ta and/or W may be used. In this case, since oxygen affinity of the second magnetic layer 140 decreases, defects due to coupling of the second magnetic layer 140 and the tunnel barrier layer 130, positioned under the second magnetic layer 140, may be prevented. As a result, the stray field from the second magnetic layer 140 may be reduced, and the required characteristics of the tunnel barrier layer 130 may be satisfied.

Fourth, a refractory metal with a melting point higher than a certain threshold value, for example, 2000° C. or more may be used as the non-magnetic material added to the second magnetic layer 140. For example, Mo, Nb, Ta and/or W may be used. In this case, diffusion of the non-magnetic material from the second magnetic layer 140 to another layer may be reduced. As a result, the stray field from the second magnetic layer 140 may be reduced, and deterioration of characteristics of other layers, due to the diffusion of the non-magnetic material, may be prevented.

The above and other memory circuits or semiconductor devices based on the disclosed technology can be used in various devices or systems. FIGS. 6-10 provide some examples of devices or systems that can implement memory circuits disclosed herein.

Figure 6:
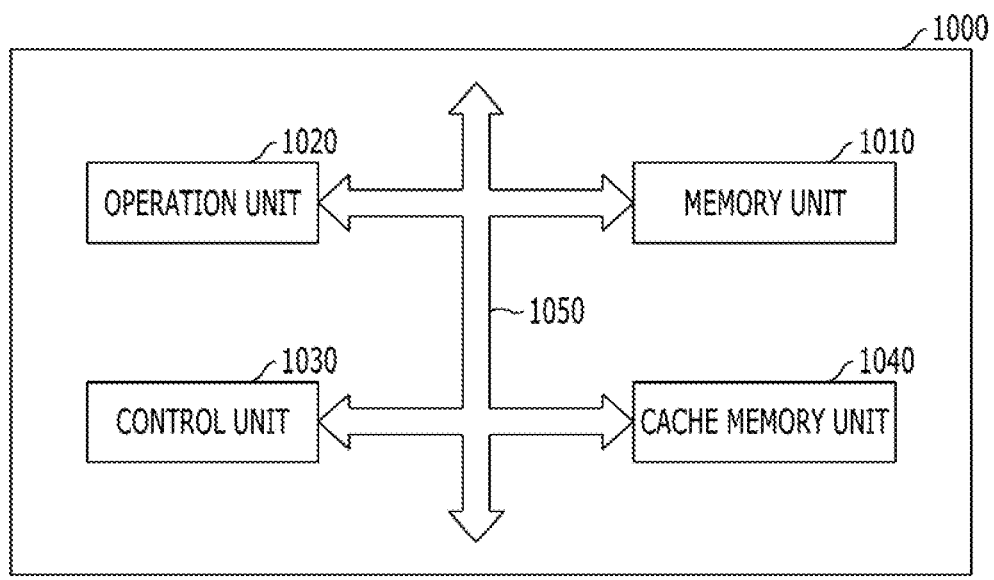
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first magnetic layer having a variable magnetization direction; a second magnetic layer having a pinned magnetization direction; and a tunnel barrier layer interposed between the first magnetic layer and the second magnetic layer, wherein the second magnetic layer includes a ferromagnetic material with molybdenum (Mo) added thereto. Through this, a fabrication process of the memory unit 1010 may be easy and data storage characteristics of the memory unit 1010 may be improved. As a consequence, operating characteristics of the microprocessor 1000 may be improved.

The operation unit 1020 may perform four arithmetical operations or logical operations according to results that the control' unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
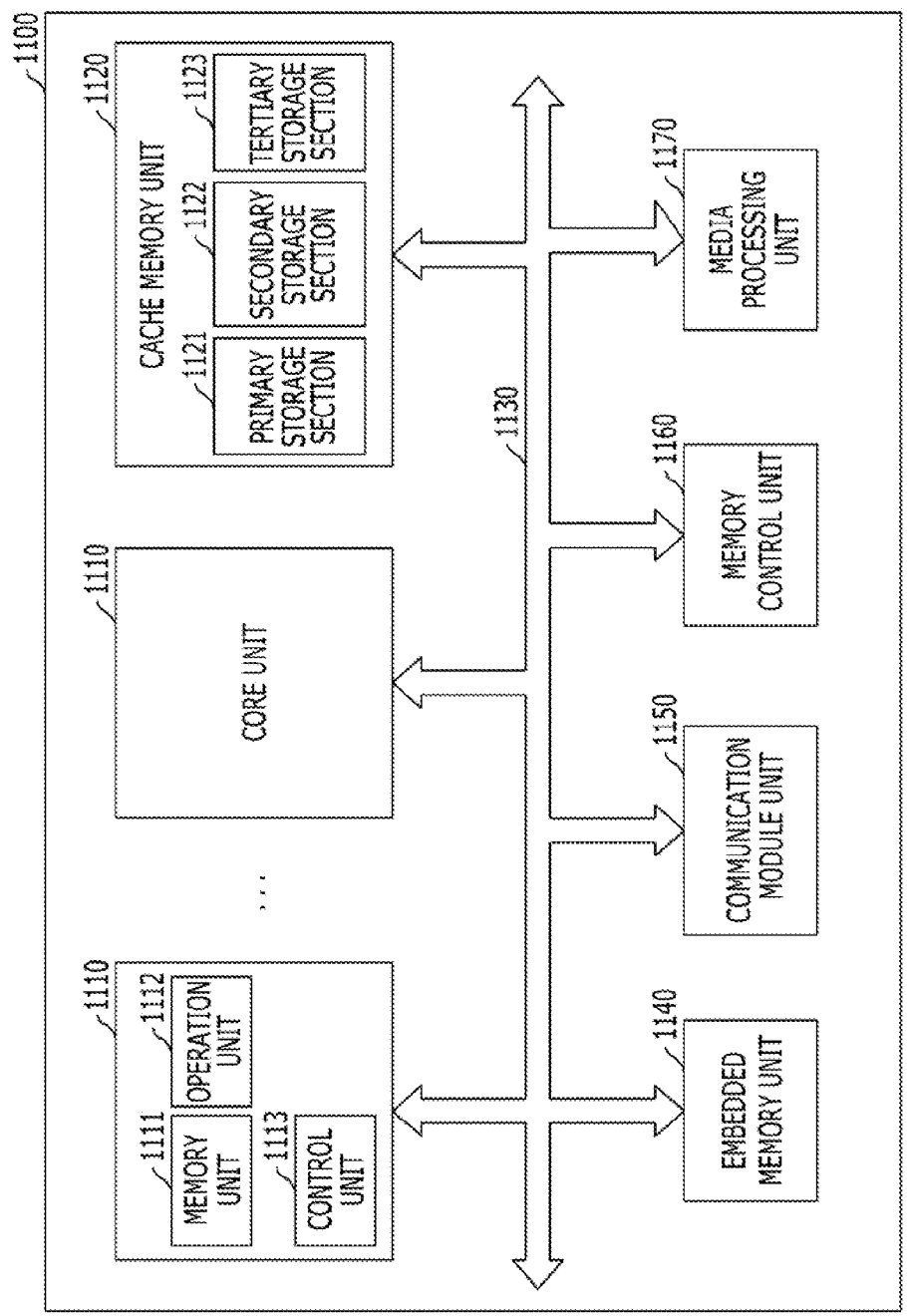
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize mufti-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first magnetic layer having variable magnetization direction; a second magnetic layer having a pinned magnetization direction; and a tunnel barrier layer interposed between the first magnetic layer and the second magnetic layer, wherein the second magnetic layer includes a ferromagnetic material with molybdenum (Mo) added thereto. Through this, a fabrication process of the cache memory unit 1120 may be easy and data storage characteristics of the cache memory unit 1120 may be improved. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB) an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (CDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CE) card, and so on.

The media processing unit 1170 may process the data processed in the processor 1100 or the data inputted in the forms of image voice and others from the external input device and output the data to the external interface device. The media processing unit 1170 may include a graphic processing unit (GPU), a digital signal' processor (DSP), a high definition audio device (HD audio), a high definition multimedia interface (HDMI) controller, and so on.

Figure 8:
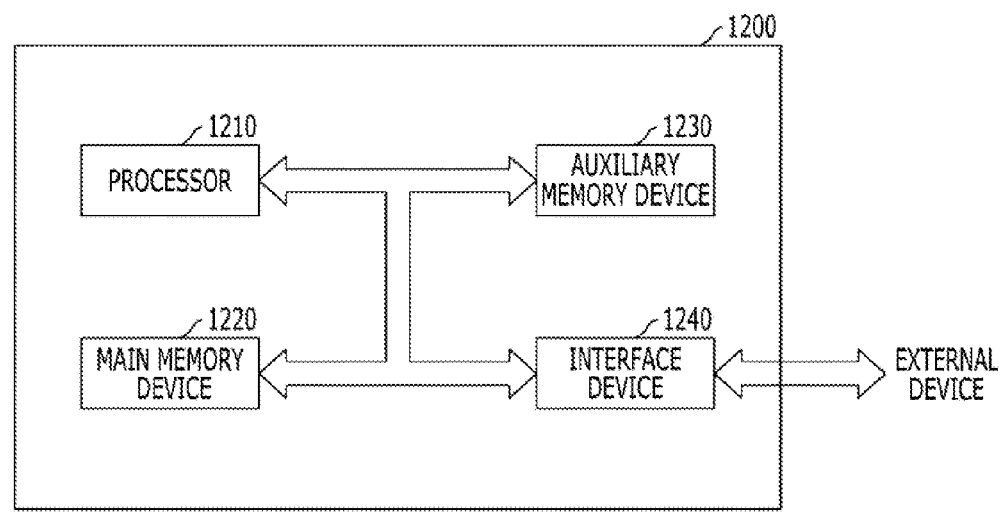
FIG. 8 is an example of configuration diagram of a system implementing memory circuitry based on the disclosed technology, storage system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first magnetic layer having a variable magnetization direction; a second magnetic layer having a pinned magnetization direction; and a tunnel barrier layer interposed between the first magnetic layer and the second magnetic layer, wherein the second magnetic layer includes a ferromagnetic material with molybdenum (Mo) added thereto. Through this, a fabrication process of the main memory device 1220 may be easy and data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first magnetic layer having a variable magnetization direction; a second magnetic layer having a pinned magnetization direction; and a tunnel barrier layer interposed between the first magnetic layer and the second magnetic layer, wherein the second magnetic layer includes a ferromagnetic material with molybdenum (Mo) added thereto. Through this, a fabrication process of the auxiliary memory device 1230 may be easy and data storage characteristics of the auxiliary memory device 1230 may be improved. As a consequence, operating characteristics of the system 1200 may be improved.

Also the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
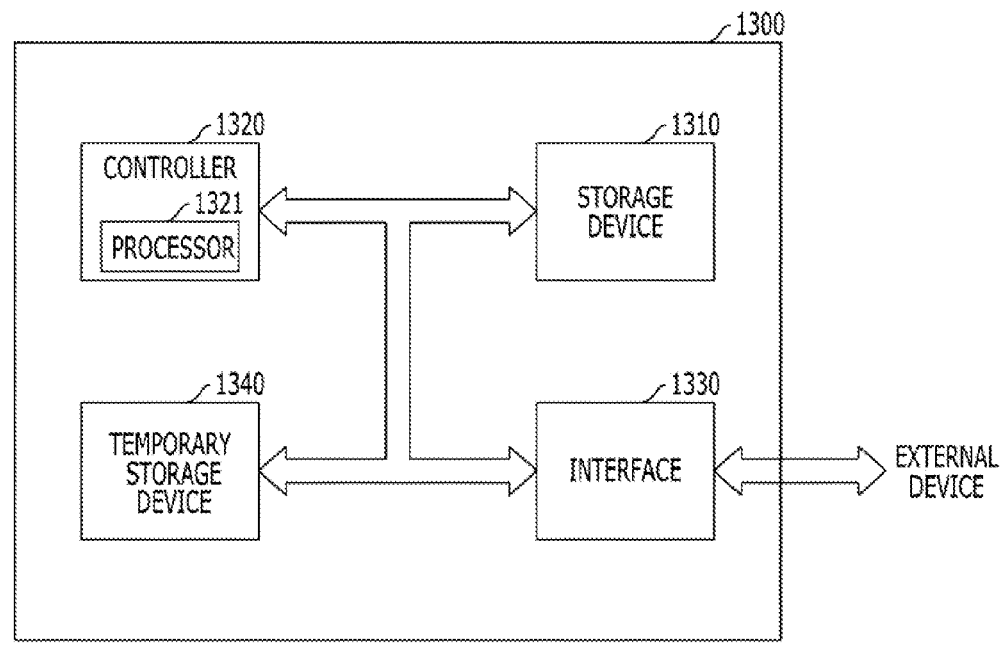

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics) SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first magnetic layer having a variable magnetization direction; a second magnetic layer having a pinned magnetization direction; and a tunnel barrier layer interposed between the first magnetic layer and the second magnetic layer, wherein the second magnetic layer includes a ferromagnetic material with molybdenum (Mo) added thereto. Through this, a fabrication process of the storage device 1310 or the temporary storage device 1340 may be easy and data storage characteristics of the storage device 1310 or the temporary storage device 1340 may be improved. As a consequence, operating characteristics and data storage characteristics of the data storage system 1300 may be improved.

Figure 10:
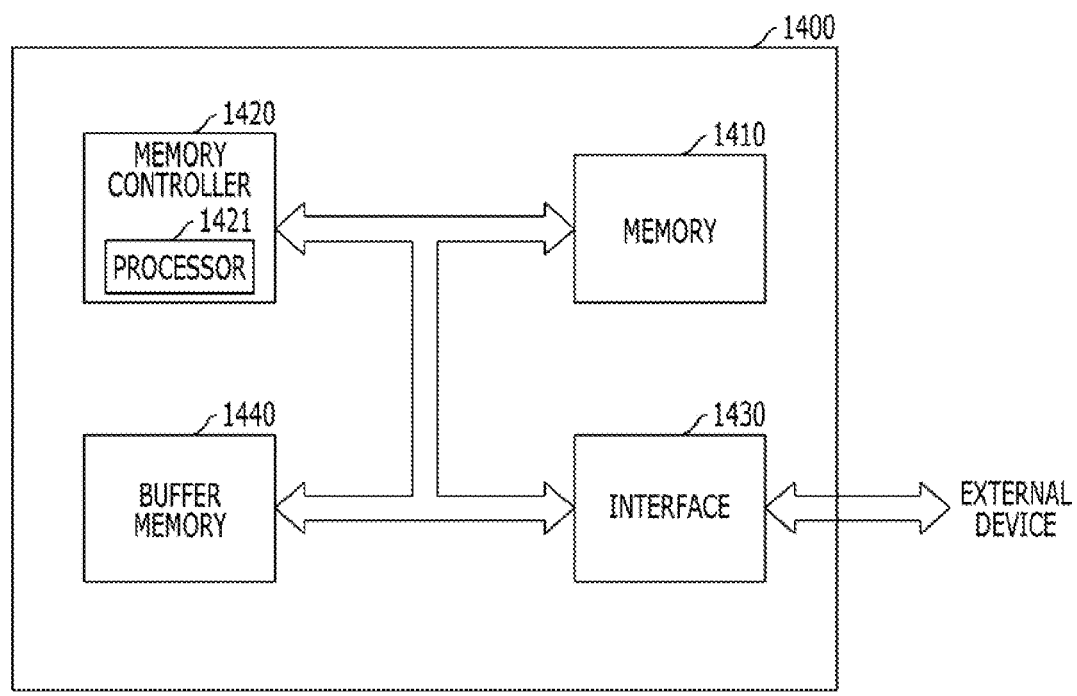
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC) an embedded MMC (eMMC) a compact flash (CF) card, and so on.

The memory 1410 for storing data may include one or more of the above-described semiconductor devices in accordance with the implementations. For example, the memory 1410 may include a first magnetic layer having a variable magnetization direction; a second magnetic layer having a pinned magnetization direction; and a tunnel barrier layer interposed between the first magnetic layer and the second magnetic layer, wherein the second magnetic layer includes a ferromagnetic material with molybdenum (Mo) added thereto. Through this, a fabrication process of the memory 1410 may be easy and data storage characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first magnetic layer having a variable magnetization direction; a second magnetic layer having a pinned magnetization direction; and a tunnel barrier layer interposed between the first magnetic layer and the second magnetic layer, wherein the second magnetic layer includes a ferromagnetic material with molybdenum (Mo) added thereto. Through this, a fabrication process of the buffer memory 1440 may be easy and data storage characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, achieve desirable results. Moreover, the separation of various system components in the embodiments described in this patent document should not be understood as requiring such separation in all embodiments.

Only a few implementations and examples are described. Other implementations enhancements and variations can be made based on what is described and illustrated in this patent document.

What is claimed is:

1. An electronic device comprising a semiconductor memory, wherein the semiconductor memory includes:
   a first magnetic layer having a variable magnetization direction;
   a second magnetic layer having a pinned magnetization direction; and
   a tunnel barrier layer interposed between the first magnetic layer and the second magnetic layer,
   wherein the second magnetic layer includes FeCoB and molybdenum (Mo) as an additive,
   wherein a content of the molybdenum in the second magnetic layer is more than zero and less than 10%, and
   wherein the second magnetic layer has a thickness of 10 Å to 30 Å.

2. The electronic device of claim 1, wherein the first magnetic layer includes the ferromagnetic material, and
   wherein the second magnetic layer includes the ferromagnetic material which is substantially same as that included in the first magnetic layer and further includes molybdenum.

3. The electronic device of claim 1, wherein the variable magnetization direction of the first magnetic layer is substantially perpendicular to a surface of the first magnetic layer,
   wherein the pinned magnetization direction of the second magnetic layer is substantially perpendicular to a surface of the second magnetic layer.

4. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory is part of the memory unit in the microprocessor.

5. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory is part of the cache memory unit in the processor.

6. The electronic device according to claim 1, further comprising a processing system which includes:
   a processor configured to decode a command received by the processor and control an operation for information based on a result of decoding the command;
   an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

7. The electronic device according to claim 1, further comprising a data storage system which includes:

- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside, wherein the semiconductor memory is part of the storage device or the temporary storage device in the data storage system.

8. The electronic device according to claim 1, further comprising a memory system which includes:

- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside, wherein the semiconductor memory is part of the memory or the buffer memory in the memory system.

* * * * *